(12) United States Patent
Detcheverry et al.

(10) Patent No.: US 8,653,926 B2
(45) Date of Patent: Feb. 18, 2014

(54) INDUCTIVE AND CAPACITIVE ELEMENTS FOR SEMICONDUCTOR TECHNOLOGIES WITH MINIMUM PATTERN DENSITY REQUIREMENTS

(75) Inventors: Celine Juliette Detcheverry, Leuven (BE); Wibo Daniel Van Noort, Leuven (BE)

(73) Assignee: NXP B.V., Eindhoven (NL)

( * ) Notice: Subject to any disclaimer, the term of this patent is extended or adjusted under 35 U.S.C. 154(b) by 1535 days.

(21) Appl. No.: 10/564,582

(22) PCT Filed: Jul. 15, 2004

(86) PCT No.: PCT/IB2004/051234
§ 371 (c)(1),
(2), (4) Date: Jan. 12, 2006

(87) PCT Pub. No.: WO2005/008695
PCT Pub. Date: Jan. 27, 2005

(65) Prior Publication Data
US 2006/0163692 A1    Jul. 27, 2006

(30) Foreign Application Priority Data

Jul. 23, 2003 (EP) .................................... 03102261

(51) Int. Cl.
  *H01F 5/00* (2006.01)
(52) U.S. Cl.
  USPC ........................................................ 336/200
(58) Field of Classification Search
  USPC ........................................................ 336/200
  See application file for complete search history.

(56) References Cited

U.S. PATENT DOCUMENTS

| 5,459,093 A | 10/1995 | Kuroda et al. |
| 6,310,378 B1 | 10/2001 | Letavic et al. |

(Continued)

FOREIGN PATENT DOCUMENTS

| DE | 100 12 118 | 11/2000 |
| JP | 2001230375 A | * 8/2001 |
| WO | WO 98/50956 | 11/1998 |

OTHER PUBLICATIONS

De Cock W et al: "A CMOS 10 GHz Voltage Controlled LC-Oscillator With Integrated High-Q Inductor"; ESSCIRC 2001; Proceedings of the 27th European Solid-State Cirucits Conference Frontier Group Paris; France 2001; pp. 496-499.

*Primary Examiner* — Alexander Talpalatski
*Assistant Examiner* — Joselito Baisa

(57) ABSTRACT

The present invention provides a semiconductor device comprising a plurality of layers, the semiconductor device comprising:—a substrate having a first major surface,—an inductive element fabricated on the first major surface of the substrate, the inductive element comprising at least one conductive line, and—a plurality of tilling structures in at least one layer, wherein the plurality of tilling structures are electrically connected together and are arranged in a geometrical pattern so as to substantially inhibit an inducement of an image current in the tilling structures by a current in the inductive element. It is an advantage of the above semiconductor device that, by using such tilling structures, an inductive element with improved quality factor is obtained. The present invention also provides a method for providing an inductive element in a semiconductor device comprising a plurality of layers.

20 Claims, 7 Drawing Sheets

(56) References Cited

U.S. PATENT DOCUMENTS

| | | |
|---|---|---|
| 6,310,387 B1 | 10/2001 | Seefeldt et al. |
| 6,362,012 B1 | 3/2002 | Chi et al. |
| 6,437,409 B2 | 8/2002 | Fujii |
| 6,489,663 B2 * | 12/2002 | Ballantine et al. ............ 257/531 |
| 6,496,242 B1 * | 12/2002 | Moon ........................... 349/143 |
| 6,522,007 B2 | 2/2003 | Kouno et al. |
| 6,693,315 B2 * | 2/2004 | Kuroda et al. ................ 257/288 |
| 6,730,983 B2 * | 5/2004 | Minami ........................ 257/531 |
| 6,784,548 B2 | 8/2004 | Kouno et al. |
| 2002/0074620 A1 | 6/2002 | Yue |

* cited by examiner

INDUCTIVE AND CAPACITIVE ELEMENTS FOR SEMICONDUCTOR TECHNOLOGIES WITH MINIMUM PATTERN DENSITY REQUIREMENTS

The present invention relates to processing of inductive and capacitive elements in advanced semiconductor technologies with minimum pattern density requirements as well as semiconductor devices including the elements.

Conventional semiconductor devices typically comprise a semiconductor substrate, generally of doped monocrystalline silicon, and a plurality of sequentially formed dielectric layers and conductive patterns. An integrated circuit is formed containing a plurality of conductive patterns comprising conductive lines separated by inter-wiring spacings. Typically, conductive patterns on different layers are electrically connected by a conductive plug filling a via hole through an insulating layer. Semiconductor chips comprising five or more levels of moralization are becoming more prevalent as device geometries shrink to sub-micron levels.

Because of miniaturization of electronics over the last few years, it has become possible to integrate more functionality in a smaller volume. This integration has been made possible amongst others by above-mentioned improvements in the field of IC technology. The improvements in the field of IC technology in combination with a need of the market for electronic products in the field of communication, e.g. in the field of mobile telephony, have led to e.g. integrated radio frequency (RF) circuits in which planar inductive elements such as coils and transformers are used. Applications of such circuits are to be found in for instance wireless communication devices, such as cellular phones and wireless LAN stations.

Dummy structures or tilling structures, also called studs, are used to respectively increase or decrease the pattern density in respectively empty or large metal areas. Tilling structures improve manufacturability on a number of points:

1) The improved planarity enlarges the process window of lithography an processing of subsequent layers.
2) The uniformity of Chemical Mechanical Polishing (CMP) removal rate is improved, and becomes independent of the patterns (mask-set) that is used.
3) The integrity of low-k dielectrics is improved by avoiding large areas of this (often fragile) material.

It is known, as described in "A CMOS 10 GHz Voltage Controlled LC-Oscillator with integrated high-Q inductor", Wouter De Cock and Michiel Steyaert, Conference Esscirc 2001, proceedings p. 496-499, to insert dummy structures to keep different layers as planar as possible and to reduce the deterioration of low-k materials during further processing. This insertion of dummy structures, in particular for RF circuits, introduces small structures inside and around the coil. A disadvantage of these structures is that Eddy currents that are induced in the dummy structures by the magnetic field of the inductor can increase the resistive losses of the inductor and thus deteriorate the quality factor Q of the coil. This is the reason why the generation of dummy structures is usually suppressed in the vicinity of inductors. Since inductors can be fairly large, the area that is kept free of dummy structures is also relatively large. This has serious consequences for the CMP process window.

It is an object of the present invention to provide a high quality inductive element in a semiconductor device such as an integrated circuit for example, and a method of manufacturing the same, the element being processed with minimum pattern density requirements. High quality inductors preferably have a large quality factor (Q), a sufficiently large inductance, a relatively low resistance and a low capacitive coupling to the substrate onto which the inductor is formed.

The above objective is accomplished by a method and device according to the present invention.

It is an advantage of the present invention that the high quality inductive element can be combined with a high quality capacitive element.

In one aspect, the present invention provides a semiconductor device comprising a plurality of layers, the semiconductor device comprising:

a substrate having a first major surface, an inductive element fabricated on the first major surface of the substrate, the inductive element comprising at least one conductive line, and a plurality of tilling structures in at least one layer, wherein the plurality of tilling structures are electrically connected together and are arranged in a geometrical pattern so as to substantially inhibit an inducement of an image current in the tilling structures by a current in the inductive element.

It is an advantage of the above semiconductor device that, by using such tilling structures, an inductive element with a higher quality factor is obtained. The plurality of tilling structures are preferably arranged in a pattern so as to obtain a good quality factor, preferably the best quality factor possible, for the inductive element processed with minimum pattern density requirements.

The tilling structures are made from tilling structure material, such as metal for example. The plurality of tilling structures may be arranged in a pattern so that the amount of tilling structure material in an area closer to the inductive element, where the magnetic field is higher, is smaller than the amount of tilling structure material in an area farther away from the inductive element. This way, a high density pattern is obtained in the center of the coil and a low density pattern is obtained close to the inductor path, which pattern will less disturb the quality factor of the inductive element.

The tilling structures may be located at different layers, tilling structures at each layer being arranged in a geometrical pattern so as to substantially inhibit an inducement of an image current in the tilling structures by a current in the inductive element. The geometrical pattern of tilling structures at two different layers may be different in shape and/or orientation, or it may be the same. The tilling structures at different layers may be electrically connected to each other.

The tilling structures may be connected to a DC potential. The DC potential may be ground potential.

The tilling structures may be a plurality of slender elongate elements, having a finger-shape for example. Alternatively, the tilling structures may be a plurality of substantially triangular elements. The elements of the tilling structures may be locally oriented perpendicular to the at least one conductive line of the inductive element.

The geometrical pattern in at least one layer may be a radial pattern.

A semiconductor device according to the present invention may furthermore comprise a ground shield for shielding the inductive element from a further layer. The further layer may be the substrate.

The semiconductor device may furthermore comprise connection means electrically connecting the plurality of tilling structures with the ground shield without creating a conductive loop.

The conductive line of the inductive element may be arranged as a spiral. The conductive line of the inductive element is arranged as a single turn inductor.

The tilling structures may be formed in a region other than a region directly below the inductive element.

A semiconductor device according to the present invention may furthermore be provided with a further passive element, such as a capacitive element for example. The capacitive element may comprise two capacitor electrodes, at least one of the capacitor electrodes being formed by a plurality of tilling structures. A capacitor electrode formed by a plurality of tilling structures may lead to a density of conductive material, such as metal or polysilicon, possibly silicided polysilicon, or active region, in the inductor vicinity respecting the design rules of advanced IC technologies.

One capacitor electrode of the capacitive element may be formed by the ground shield.

The integration of the capacitive element with the inductive element may be optimized to respect the metal pattern density in advanced silicon technologies.

The distance between the capacitive element and the inductive element may be large enough to avoid a dominant fringe coupling between them. The distance between the capacitive element and the inductive element in a direction substantially parallel with the first major surface of the substrate may be large compared to the distance between the capacitor plates in a direction substantially perpendicular to the first major surface of the substrate, for example twice that distance or more. Alternatively, the distance between the capacitive element and the inductive element in a direction substantially parallel with the first major surface of the substrate may large compared to the distance between the inductive element and a ground shield in a direction substantially perpendicular to the first major surface of the substrate, for example twice that distance or more.

The distance between the capacitive element and the inductive element may be large compared to the distance between the capacitor plates, at least a factor 10 or more larger, and to the distance between the inductor and its ground shield, at least a factor 2 or more larger.

In a second aspect, the present invention provides a method for providing an inductive element in a semiconductor device comprising a plurality of layers, the method comprising:

providing a substrate having a first major surface,
forming an inductive element above the first major surface of the substrate, the inductive element comprising at least one conductive line,
providing a plurality of tilling structures in at least one layer,
wherein the plurality of tilling structures are electrically connected together and are arranged in a geometrical pattern so as to substantially inhibit an inducement of an image current in the tilling structures by a current in the inductive element.

These and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference Figures quoted below refer to the attached drawings.

Figure 1:
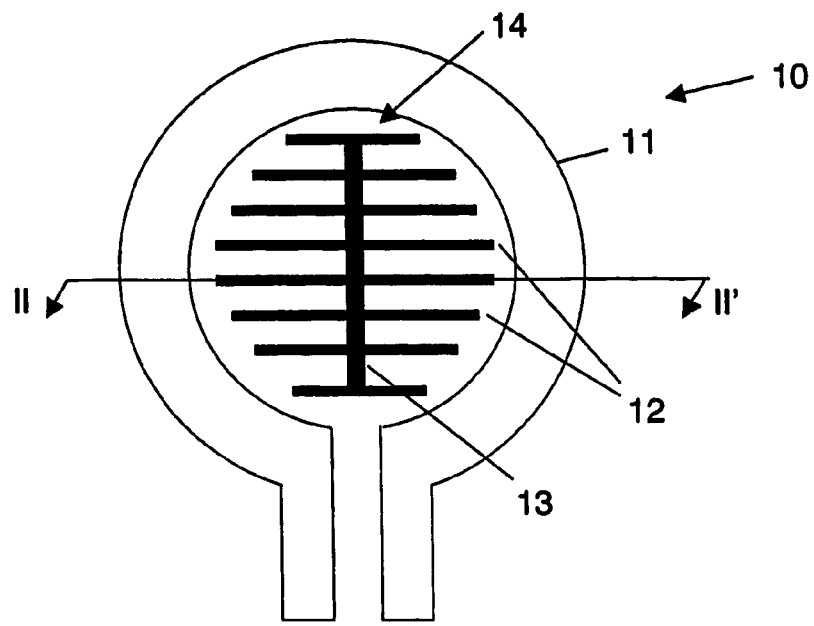
FIG. 1 is a schematic partially transparent top view of semiconductor device comprising a single-turn inductive element and a plurality of finger-like tilling structure pattern layers, of which only one is visible, according to an embodiment of the present invention.

In the different Figs., the same reference Figs. refer to the same or analogous elements.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Where an indefinite or definite article is used when referring to a singular noun e.g. "a" or "an", "the", this includes a plural of that noun unless something else is specifically stated.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

In accordance with a first embodiment of the present invention, a semiconductor device comprising an inductive element is provided on a substrate, the semiconductor device comprising a plurality of layers. In embodiments of the present invention, the term "substrate" may include any underlying material or materials that may be used, or upon which a device, a circuit or an epitaxial layer may be formed. In other alternative embodiments, this "substrate" may include a semiconductor substrate such as e.g. a doped silicon, a gallium arsenide (GaAs), a gallium arsenide phosphide (GaAsP), an indium phosphide (InP), a germanium (Ge), or a silicon germanium (SiGe) substrate. The "substrate" may include for example, an insulating layer such as a $SiO_2$ or an $Si_3N_4$ layer in addition to a semiconductor substrate portion. Thus, the term substrate also includes silicon-on-glass, silicon-on sapphire substrates. The term "substrate" is thus used to define generally the elements for layers that underlie a layer or portion of interest. Also, the "substrate" may be any other base on which a layer is formed, for example a glass or metal layer. In the following processing will mainly be described with reference to silicon processing but the skilled person will appreciate that the present invention may be implemented based on other semiconductor material systems and that the skilled person can select suitable materials as equivalents of the dielectric and conductive materials described below.

In one aspect, an inductive element may be a planar or a non-planar single-turn inductor, or a planar or non-planar spiral inductor comprising a plurality of turns. The shape of the inductive element may be circular, square, hexagonal, octagonal, meander-shaped, or the inductive element may have any suitable other shape. The wiring of the inductor may extend over two or more metal layers, usually top metal layers, these top metal layers being the metal layers furthest away from the substrate. The size of the spiral inductor may be hundreds of microns square or less. For present technologies it is typically between 40 $\mu m^2$ and 500 $\mu m^2$. The inductive element may comprise a single conductive line or a plurality of conductive line segments.

Between the substrate and the inductive element, a plurality of conductive and insulating layers may be provided. Also, if the inductive element extends over two or more metal layers, then in between two layers of an inductive element at least one insulating layer is provided.

In at least one layer of the semiconductor device, dummy elements or tilling structures are provided. These tilling structures may be used to prevent dishing and/or delamination when carrying out a polishing process such as CMP. Contrary to the dummy structures known from the prior art, which are small pillars separated from each other, all or significant parts of the tilling structures according to the present invention are electrically connected to each other and are arranged in a geometrical pattern so as to form a tilling structure pattern. Furthermore, the tilling structure pattern has a shape such that it substantially inhibits an inducement of an image current in the tilling structure pattern due to current flowing through the conductor of the inductive element. The tilling structure pattern may for example be a grating composed of a collection of locally isolated conductive lines locally separated by slots. All conductive lines of the tilling structure pattern are electrically connected to each other and to a DC voltage, for example to ground (0 Volts). The conductive lines of the tilling structure pattern preferably do not cross the inductor path(s).

FIG. 1 shows a partially transparent top view of a semiconductor device 10 according to the present invention. The semiconductor device 10 is built of a plurality of layers, and comprises an inductive element 11. The inductive element 11 of the semiconductor device 10 of FIG. 1 consists of a single loop conductive element. However, the invention is not limited thereto. At the inside area of the inductive element 11, a plurality of tilling structures are provided. In the embodiment shown, the tilling structures consist of elongate metal strips 12, which are connected to each other by means of an interconnection strip 13, thus forming a finger-like or comb-like tilling structure pattern 14.

Figure 2:
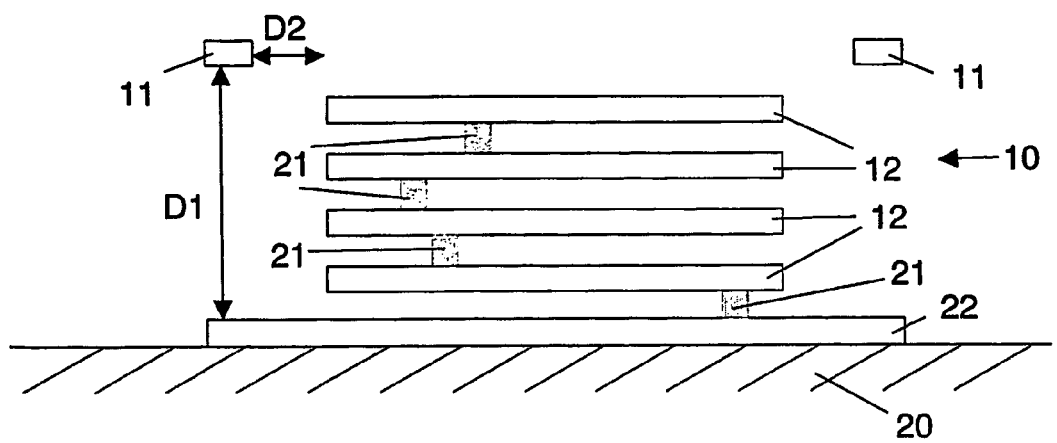
FIG. 2 is a vertical cross-section of the semiconductor device of FIG. 1.

FIG. 2 illustrates a vertical cross-section of the semiconductor device 10 of FIG. 1, at a position indicated with II-II' in FIG. 1. A plurality of layers are provided on a substrate 20. Those layers comprise conductive and insulating layers.

In the embodiment illustrated, the tilling structure patterns 14 are formed in a plurality of subsequent metal layers M1, M2, M3, M4. In fact the tilling structure patterns 14 may be formed in every layer where they are needed. An example of a 5 metal layer process according to the present invention is shown in Table 1 hereunder.

TABLE 1

| | |
|---|---|
| Metal 5 | Inductor layer |
| Metal 4 | Tilling structure pattern layer |
| Metal 3 | Tilling structure pattern layer |
| Metal 2 | Tilling structure pattern layer |
| Metal 1 | Tilling structure pattern layer |
| silicided Polysilicon | Ground shield layer |

This means that, for the 5 metal layer process described, the inductive element II is formed by means of metal 5, the topmost metal layer. In between the topmost metal layer M5 and the substrate 20, a plurality of tilling structure pattern layers are provided, consisting of metal 1, metal 2, metal 3 and metal 4. In the embodiment illustrated, each of the tilling structure patterns at different layers have the same shape and the same orientation. However, the invention is not limited thereto: tilling structure patterns at different layers can have the same shape but a different orientation, or they can even have a different shape, as long as the shape of the tilling structure patterns substantially inhibits the inducement of image currents in the tilling structures by a current in the inductive element 11. As can be seen in FIG. 1, all elongate metal strips 12 of a tilling structure pattern 14 at one metal layer are electrically connected to each other by means of an interconnection strip 13. It is advantageous to provide the interconnection strip 13 substantially in the center of the tilling structure pattern 14 rather than at the extremities thereof, because if provided at the extremities the chances increase of creating a conductive path in which image currents can be generated. Furthermore, all tilling structure patterns 14 of different metal layers are electrically connected to each other by means of vias 21. In between every two metal layers, insulating layers are provided.

It can be seen on FIG. 2 that the tilling structure patterns 14 do not cross a location above the substrate 20 where the inductive element 11 is provided.

According to an embodiment of the present invention, a ground shield 22, preferably a patterned ground shield, may be fabricated above or near an interface of the substrate 20, for example a semiconductor layer, e.g. a silicon substrate layer, with an insulating layer, e.g. a silicon oxide layer. The patterned ground shield 22 may be a grating composed of a collection of locally isolated conductive lines locally separated by slots and mutually grounded. Preferably, each of the conductive lines in the ground shield grating is positioned orthogonal to the conductive line segments in the inductive element 11 above it. In that case, the patterned ground shield does not allow the flow of counter-currents or Eddy currents induced by changes in the magnetic flux by current flowing through the inductive element 11. Although it is normally preferable to pattern the ground shield 22 so that all the conductive lines of the ground shield 22 are oriented perpendicular to the conductive lines of the inductive element 11, significant reduction in ground shield image can also be obtained with other patterns.

The ground shield 22 is processed in a lower layer, typically in silicided polysilicon or metal 1; in the example given above in Table 1 it is processed in silicided polysilicon. The shield lines go under the inductor path(s) and are responsible for a parasitic capacitor between the ground shield 22 and the inductive element 11 and thus for a decreased resonance frequency. Hence, the ground shield layer preferably is placed as far as possible from the inductor layer, in order to decrease the parasitic capacitance.

The slots which separate adjacent conductive lines of the ground shield are preferably very narrow in comparison with the width of the conductive lines. As a result, the patterned ground shield still blocks the penetration of electric field lines of the inductive element to the substrate. Accordingly, the performance of the inductive element is not reduced by losses arising from penetration of the electric field into the substrate, and coupling through the substrate between the inductor and other nearby circuit elements is reduced. Preferably, the thickness of the ground shield is significantly less than the skin depth at the frequency of interest in order to avoid attenuation of the magnetic field and reductions of the effective inductance of the inductive element.

In the embodiment described, the tilling structure patterns 14 are located between the ground shield 22 and the inductive element 11. In other embodiments, although not represented, all or part of the tilling structure patterns 14 may be located above the inductive element 11, so that the inductive element 11 is located between the ground shield 22 and at least one of the tilling structure patterns 14. The tilling structure patterns 14 are all connected to a same DC potential. Hence, any capacitive effect between the different tilling structure pattern layers is avoided. Preferably the tilling structure patterns 14 are connected to the ground shield provided underneath the inductive element 11. The inductor parasitic capacitance is dominated by the capacitance between the inductive element 11 and the ground shield 22. The tilling structure pattern 14 allows to connect all metals within the inductor vicinity to the ground shield 22 without creating a conductive loop. Therefore, the tilling structure pattern avoids parasitic capacitance effects.

When using the tilling structure patterns, e.g. the metal pattern proposed hereinabove, the inductor parasitic capacitance is also influenced by a fringe capacitance between the metal pattern of the tilling structure pattern 14 and the inductive element 11. FIG. 1 shows a top view of a single-loop inductive element 11 and a tilling structure pattern 14 according to the present invention. As mentioned before, the distance D1 between the inductive element 11 and the ground shield 22 (not represented in FIG. 1 but represented in FIG. 2) should be optimized, i.e. should be as large as possible in order to avoid parasitic capacitance between the inductive element 11 and the ground shield 22. Furthermore, the distance D2 between the inductive element 11 and the tilling structure patterns 14 should also be optimized when taking into account as far as possible the minimum pattern density allowed by technology requirements. This means that the tilling structure patterns 14 are placed as close as possible to the center of the inductive element 11, and thus as far away from the conductive lines of the inductive element 11 as allowed by the design rules (maximum metal to metal requirements).

In FIG. 1 the shape of the tilling structure pattern 14 is finger-like or comb-like, i.e. the pattern comprises a plurality of substantially parallel lines 12 which are all connected to each other by means of a further line 13 which is substantially perpendicular to the plurality of parallel lines 12 and is laying in the same plane.

Figure 3:
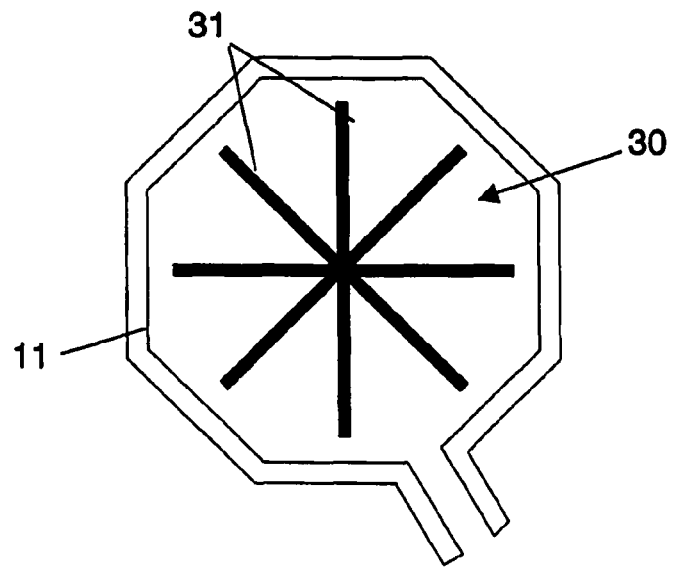
FIG. 3 is a schematic top view of a semiconductor device comprising a single-turn inductive element and a radial tilling structure pattern according to a second embodiment of the present invention.

According to the present invention, any other shape of tilling structure pattern 14 which also prevents large induced currents to flow is also valid. Another embodiment is represented in FIG. 3, which shows a radial pattern 30 for the tilling structure pattern. Due to the radial pattern, all conductive lines 31 forming the tilling structure pattern 30 are electrically connected substantially in the center point of the pattern. In the embodiment shown in FIG. 3, the inductive element 11 consists of a plurality of conductive line segments. It is an advantage of the radial pattern 30 combined with the octagonal shaped inductive element 11 of FIG. 3 that each elongate strip 31 of the radial pattern 30 is located locally perpendicular to the nearest conductive segment of the inductive element 11. Because the tilling structure's conductive lines are locally perpendicular to the line segments of the inductive element 11, the tilling structure 30 does not permit the flow of counter-currents induced by changes in the flux through the inductor. Therefore, the performance of the inductive element is not reduced by such induced counter-currents, as is the case with conventional dummy structures. It is not intended to limit the embodiment of the present invention relating to radial patterns 30 to a combination of the radial pattern 30 with an octagonal shaped inductive element 11: the radial pattern 30 may be used with any suitable shape of inductive element 11, such as a substantially circular or spiral inductive element.

Figure 4:
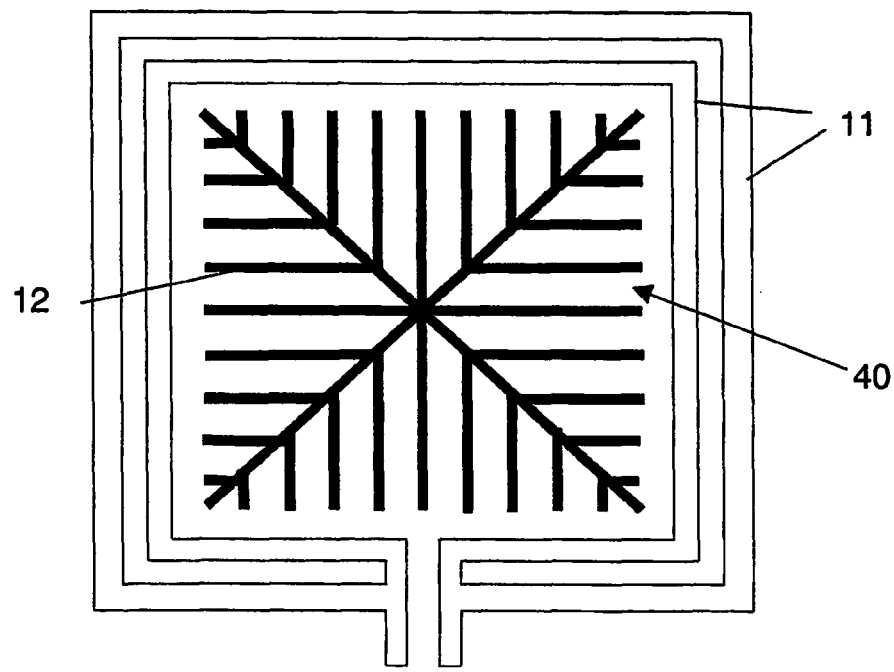
FIG. 4 is a schematic top view of a semiconductor device comprising a dual-turn inductive element and a tilling structure pattern according to a third embodiment of the present invention.

FIG. 4 illustrates a double loop rectangular conductive element 11, and a corresponding patterned tilling structure in the center area of the conductive element 11. The conductive lines 12 of the tilling structure pattern 40 are oriented roughly perpendicular to the conductive lines of the inductive element 11. Furthermore, the conductive lines 12 of the tilling structure pattern 40 are all electrically connected to each other.

Figure 5:
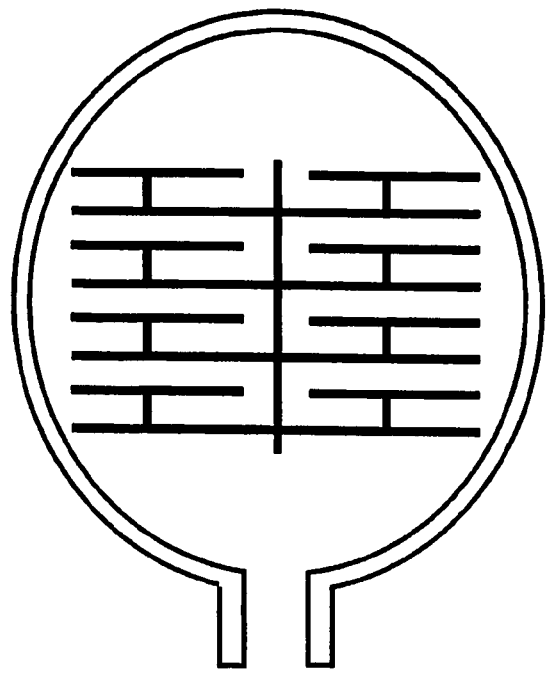
FIG. 5 is a schematic top view of a semiconductor device comprising a single-turn inductive element and a tilling structure pattern according to a fourth embodiment of the present invention.
Figure 6:
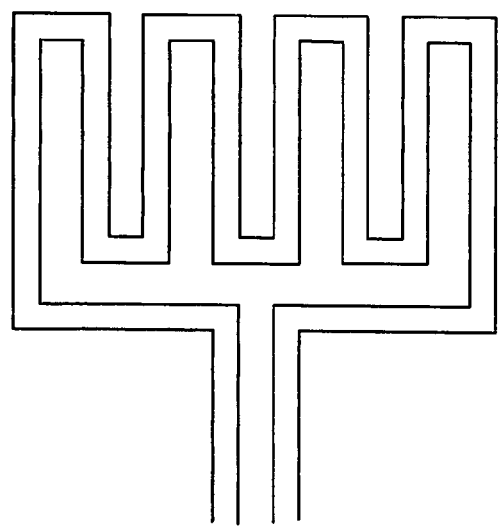
FIG. 6 is a schematic top view of an inductive element comprising a meander inductor according to a further embodiment of the present invention.

Although it is generally preferred to arrange the conductive lines in the patterned tilling structures so that they are oriented perpendicular to the conductive lines in the inductive element, good results can also be obtained with other patterns. For example the embodiment of FIG. 1, or the embodiment of FIG. 5 each show an example of a tilling structure pattern comprising parallel conductive lines. Patterns of this type are not optimal for spiral inductors since they contain conductive lines oriented parallel or substantially parallel to the conductive lines of the inductive element. Nevertheless, because these patterns still inhibit the flow of the image current, they are far superior to the separate dummy elements of the prior art. It is to be noted that these patterns can be very effective in conjunction with a meander inductor as illustrated in FIG. 6.

Up to now, only embodiments with strip-like conductive parts of the tilling structure pattern have been given. However, also other shapes are possible. For example, in the embodiment illustrated in FIG. 7, the tilling structures 70 consist of triangular shaped metal pieces 71. Those triangular shaped metal pieces 71 are all electrically connected together by means of an interconnection strip 72. Advantages of using such triangular shaped metal pieces are that the capacitance between the tip of a triangle and the inductive element is smaller, and that the amount of metal in a neighborhood of the inductive element where the magnetic field is higher (closer to the inductive element) is smaller.

Figures 7, 8:
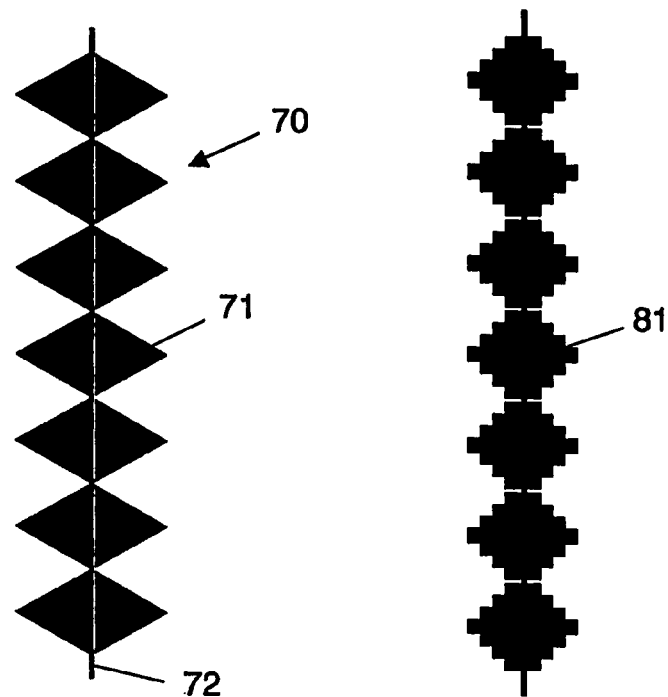
FIG. 7 and FIG. 8 illustrate other embodiments of tilling structure patterns for use according to the present invention.
Figure 9:
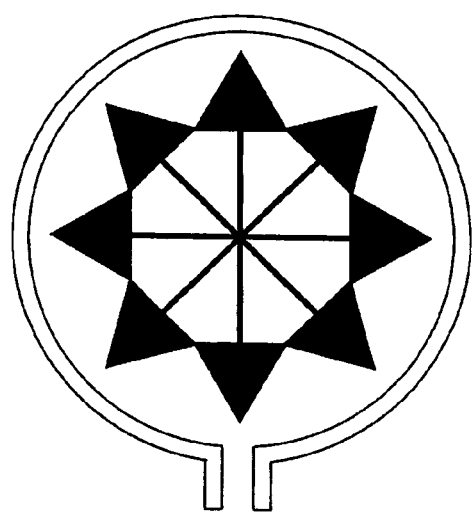
FIG. 9 illustrates yet another embodiment of a tilling structure pattern with a single-turn inductive element according to an embodiment of the present invention.

As real triangular shaped metal pieces 71 are difficult to implement, this triangular shape may be approximated by a stepwise triangular shape as in FIG. 8. The triangular parts of the tilling structure pattern can also be used in a radial pattern as illustrated in FIG. 9. It is an advantage of such triangular shaped or approximated triangular shaped tilling structure patterns that the capacitance between the tips of the triangles 71 or approximated triangles 81 and the inductive element 11 is reduced. Furthermore, the amount of metal is reduced in the neighborhood where the magnetic field of the inductive element is higher.

Due to the connection of the different tilling structures, having a line or triangle shape or any other suitable shape, to each other, contrary to the separate dummy elements in the prior art, the Q-factor of the inductive element is improved.

Usually, a capacitor and an inductor are processed together in silicon to create a transformer of an LC tank. According to the present invention, a capacitor may be processed, independent of the inductor or not, in the inductive element vicinity. With the vicinity of the inductive element is mainly meant the area enclosed by the inductor loop, as well as the area around the loop, where the two regions, inside and outside the loop, are connected together by the grounded shield if there is one.

According to the present invention, the shape used for the tilling structure pattern layer(s) may be used to build a capacitive element in the vicinity of the inductive element. The shape of the tilling structure pattern layer(s) is as described above, which may comprise any pattern that substantially inhibits an inducement of an image current in the tilling structure pattern due to current flowing through the conductor of the inductive element.

FIG. 10, FIG. 11, FIG. 12, FIG. 13 and FIG. 14 show embodiments of what a capacitive element processed in the inductor vicinity can look like according to the present invention.

Figure 10:
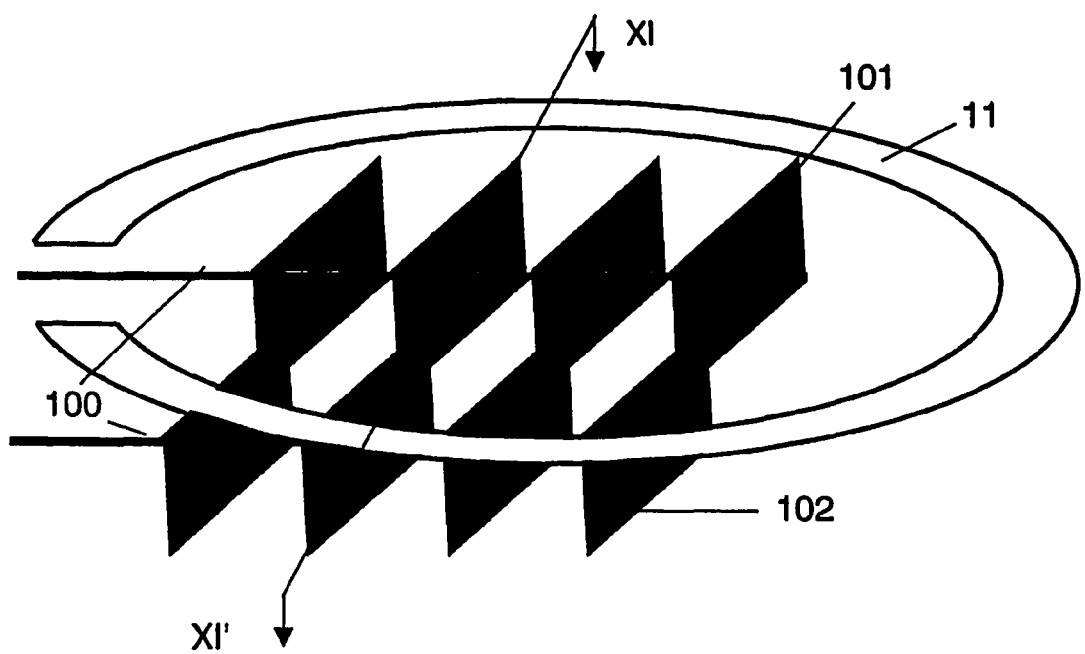
FIG. 10 is a top view of a capacitor patterned into an inductor area in accordance with a further embodiment of the present invention.
Figure 11:
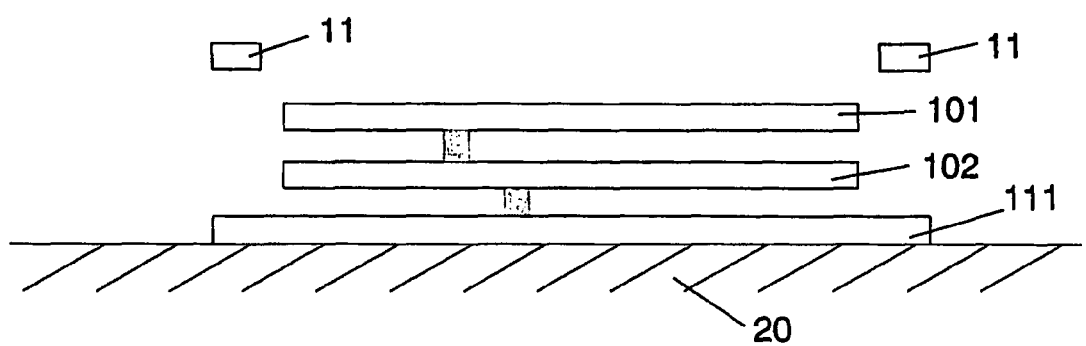
FIG. 11 is a vertical cross-section of the devices of FIG. 10.

FIG. 10 illustrates a top view of a capacitive element 100 patterned into an inductive element 11. The capacitive element 100 comprises two capacitor terminals or capacitor plates 101, 102. One capacitor terminal or capacitor plate 101 may be formed by an tilling structure pattern layer as described above, e.g. a fingerlike or comb-like structure. The other capacitor terminal or capacitor plate 102 may be formed by another tilling structure pattern layer as described above, or by the ground shield. In the embodiment represented, the second capacitor terminal or capacitor plate 102 has the same fingerlike or comb-like structure as the first capacitor terminal or capacitor plate 101, and is implemented above a (preferably patterned) ground shield 111. A vertical cross-section of the embodiment of FIG. 10 is represented in FIG. 11. In this embodiment, the first capacitor terminal or capacitor plate 101 has the same shape as the second capacitor terminal or capacitor plate 102, and both capacitor terminals or capacitor plates 101, 102 are located right above each other. This is called an overlap fingered capacitor. The capacitor fingers of each tilling structure pattern layer do not cross the inductor path.

Figure 12:
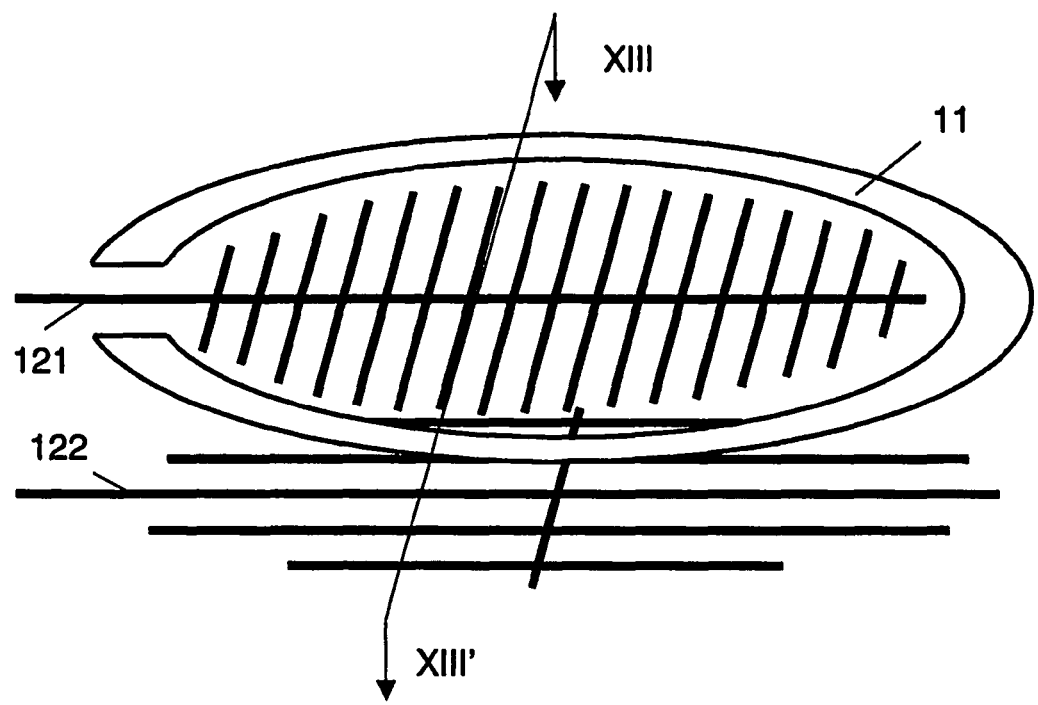
FIG. 12 and FIG. 13 illustrate a further embodiment of a capacitor patterned into an inductor area in accordance with a further embodiment of the present invention.
Figure 13:
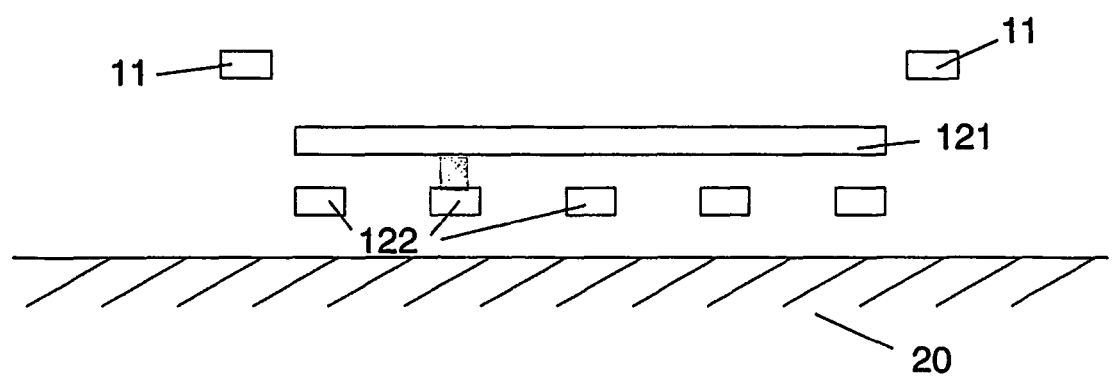

FIG. 12 and FIG. 13 illustrate, respectively in a top view and in a vertical cross-section, a second embodiment of a capacitive element according to the present invention. It shows an embodiment in which the two capacitor terminals or capacitor plates 121, 122 have substantially the same shape, but a different orientation. No ground shield is present in this embodiment.

Figure 14:
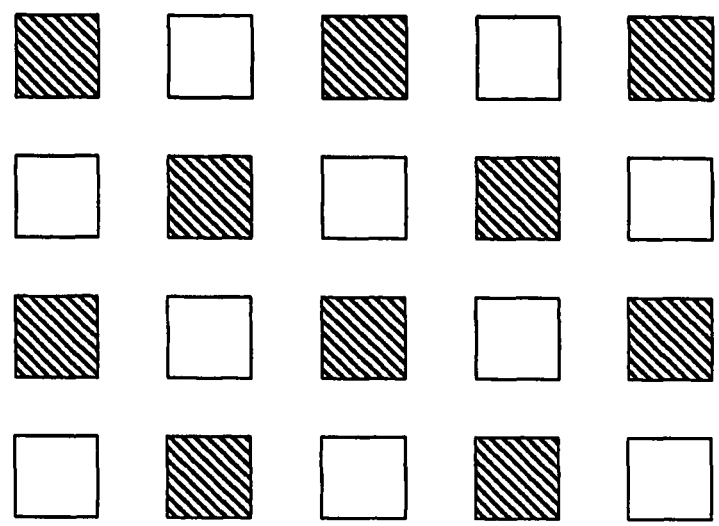
FIG. 14 illustrates a fringe capacitor which may be used in the inductor area according to a further embodiment of the present invention.

FIG. 14 shows a cross-section of a third embodiment of a capacitive element according to the present invention. The capacitor terminals do not form two separate capacitor plates. Instead, the capacitive element represented has two capacitor terminals each formed by a plurality of fingers of different layers of tilling structure patterns. All fingers which are represented as white squares in the vertical cross-section of FIG. 14 form a first capacitor terminal, and all fingers which are represented as hatched squares in FIG. 14 form the second capacitor terminal.

Due to the shape of the capacitive element according to embodiments of the present invention, the amount of current induced in the capacitive element by the magnetic field of the inductive element, and counteracting it, is minimized.

The tilling structure metal patterns according to the present invention may thus be used to form at least one plate or terminal of a capacitive element, and pillar-like tilling structures as known from the prior art are not used in the neighborhood of the inductive element.

The distance between the patterned capacitive element and the inductive element must be large enough to avoid a dominant fringe coupling between them, for example at least a factor 50 larger than the minimum metal width. The distance between the patterned capacitive element and the inductive element must be larger than the distance between the inductive element and its ground plane or ground shield (which is roughly 5 μm in present technologies) if present, for example the distance between the capacitive element and the inductive element may be twice the distance between the inductive element and its ground shield or more, i.e. for present technologies about 10 μm or more.

The present invention is particularly interesting for inductive elements with a large radius, i.e. which have a radius which is large enough to place something in the center area of the inductive element. Such large inductors are the ones concerned by the pattern density requirements, as saving semiconductor area, e.g. silicon area, is a bigger issue when the inductor is large. Moreover, for large inductors, the capacitor can be more easily designed within the inductor vicinity without modifying the parasitic capacitance of the inductor.

The capacitor can be variable if processed as an active device, e.g. polysilicon on an active area, or as diodes in the inductor area.

Table 2 and Table 3 hereinafter give examples of layers assigned to the different electrodes of the inductive element, capacitive element and shield here considered in a standard CMOS process. Tilling structures may be provided apart from capacitive elements.

TABLE 2

| | |
|---|---|
| Metal 5 | Inductor layer |
| Metal 4 | Tilling structure pattern layer |
| Metal 3 | Tilling structure pattern layer |
| Metal 2 | Tilling structure pattern layer |
| Metal 1 | Shield layer |
| Poly | Patterned variable capacitor |

TABLE 3

| | |
|---|---|
| Metal 9 | Inductor layer |
| Metal 8 | Tilling structure pattern layer |
| Metal 7 | Tilling structure pattern layer |
| Metal 6 | Tilling structure pattern layer |
| Metal 5 | Shield layer |
| Metal 4 | Patterned capacitor layer |
| Metal 3 | Patterned capacitor layer |
| Metal 2 | Patterned capacitor layer |
| Metal 1 | Shield layer |
| Poly | |

It will be appreciated by a person skilled in the art that the principles of the present invention are not limited to rectilinear spiral inductors, but apply generally to spiral inductors of any geometrical arrangement, such as hexagonal, pentagonal, octagonal and curved spiral inductors. It applies both to single turn inductors and to multi-turn inductors.

The processing steps that are used for the creation of the tilling structure pattern layers and for the patterned capacitor layers as described above are well known in the art and will therefore not be further highlighted at this time. Any suitable conductive material may be used, for example polysilicon, or metals such as e.g. copper, copper alloy or aluminum. The material for the insulating layers between the metal layers is most preferably silicon oxide, or a low-k dielectric material such as any of a number of different suitable low-k dielectric materials employed in interconnect technology, e.g. organic low-k materials such as e.g. benzocyclobutene (BCB), SILK, FLARE or inorganic dielectric low-k materials such as e.g. methyl silsesquioxane (MSQ), hydrogen silsesquioxand (HSQ), SiOF. The preferred thickness of the layers is, with present technology used, about 500 nm.

It is to be understood that although preferred embodiments, specific constructions and configurations, as well as materials, have been discussed herein for devices according to the present invention, various changes or modifications in form and detail may be made without departing from the scope and spirit of this invention. For example, while the inductor in the described embodiments has used the wiring extending over a single layer, a multi-layer realization extending over 2 or more layers may be used.

The invention claimed is:

1. A semiconductor device comprising a plurality of layers, the semiconductor device comprising:
    a substrate having a first major surface,
    an inductive element fabricated on the first major surface of the substrate of the inductive element comprising at least one conductive line,
    a plurality of tilling structures in at least one layer, the plurality of tilling structures arranged to improve manufacturability of the semiconductor device,
    wherein the plurality of tilling structures are electrically connected together and arranged in a geometrical pattern so as to substantially inhibit an inducement of an image current in the tilling structures by a current in the inductive element, and, wherein the geometrical pattern of tilling structures does not substantially inhibit inductive coupling between the inductive element and the substrate, and wherein the tilling structures are connected to a DC potential.

2. A semiconductor device according to claim 1, the tilling structures being made from tilling structure material, wherein the plurality of tilling structures are arranged in a pattern so that the amount of tilling structure material in an area closer to the inductive element is smaller than the amount of tilling structure material in an area farther away from the inductive element.

3. A semiconductor device according to claim 1, wherein the and wherein the arrangement of the tilling structures is determined by a desired pattern density of the semiconductor device for improving at least one of a process window of lithography, uniformity of chemical mechanical polishing removal rate and integrity of low-k dielectrics.

4. A semiconductor device according to claim 3, wherein the geometrical pattern of tilling structures at two different layers is different in shape and/or orientation.

5. A semiconductor device according to claim 3, wherein the tilling structures at different layers are electrically connected to each other.

6. A semiconductor device according to claim 1, wherein the tilling structures are a plurality of substantially triangular elements.

7. A semiconductor device according to claim 6, wherein the elements of the tilling structures are locally oriented perpendicular to the at least one conductive line of the inductive element.

8. A semiconductor device according to claim 1, furthermore comprising a ground shield for shielding the inductive element from a further layer.

9. A semiconductor device according to claim 8, wherein the further layer is the substrate.

10. A semiconductor device according to claim 8, furthermore comprising connection means electrically connecting the plurality of tilling structures with the ground shield without creating a conductive loop.

11. A semiconductor device according to claim 1, wherein the tilling structures are formed in a region other than a region directly below the inductive element.

12. A semiconductor device according to claim 1, furthermore provided with a further passive element.

13. A semiconductor device according to claim 12, wherein the further passive element is a capacitive element.

14. A semiconductor device according to claim 13, wherein the capacitive element comprises two capacitor electrodes at least one of the capacitor electrodes being formed by a plurality of tilling structures.

15. A semiconductor device according to claim 13, wherein the integration of the capacitive element with the inductive element is optimized to respect the metal pattern density in advanced silicon technologies.

16. A semiconductor device according to claim 13, wherein the distance between the capacitive element and the inductive element is large enough to avoid a dominant fringe coupling between them.

17. A semiconductor device according to claim 14, wherein a capacitor electrode formed by a plurality of tilling structures leads to a metal or polysilicon or active region density in the inductor vicinity respecting the design rules of advanced IC technologies.

18. A semiconductor device according to claim 14, wherein one capacitor electrode of the capacitive element is formed by a ground shield.

19. A semiconductor device comprising a plurality of layers, the semiconductor device comprising:
    a substrate having a first major surface,
    an inductive element fabricated on the first major surface of the substrate of the inductive element comprising at least one conductive line,
    a plurality of tilling structures in at least one layer, the plurality of tilling structures arranged to improve manufacturability of the semiconductor device,
    wherein the plurality of tilling structures are electrically connected together and arranged in a geometrical pattern so as to substantially inhibit an inducement of an image current in the tilling structures by a current in the inductive element, and, wherein the geometrical pattern of tilling structures does not substantially block penetration into the substrate of electric field lines generated by the inductive element, and wherein the tilling structures are a plurality of slender elongate elements.

20. A semiconductor device according to claim 19, wherein the elements of the tilling structures are locally oriented perpendicular to the at least one conductive line of the inductive element.

* * * * *